United States Patent [19]

Foster

[11] 4,250,463
[45] Feb. 10, 1981

[54] OVERLOAD PROTECTION TO PREVENT SATURATION OF VIDEO AMPLIFIERS

[75] Inventor: Raymond F. Foster, Danbury, Wis.

[73] Assignee: Telex Computer Products, Inc., Raleigh, N.C.

[21] Appl. No.: 933,436

[22] Filed: Aug. 14, 1978

[51] Int. Cl.³ .............................................. H03F 3/04
[52] U.S. Cl. ..................................... 330/298; 330/311
[58] Field of Search ................ 330/149, 207 P, 298, 330/311; 307/300

[56] References Cited

U.S. PATENT DOCUMENTS 4,109,166  8/1978  Clark, Jr. et al. ............... 307/300 X

FOREIGN PATENT DOCUMENTS 1287144  1/1969  Fed. Rep. of Germany ....... 330/207 P
476662  7/1975  U.S.S.R. ................................. 330/311

Primary Examiner—James B. Mullins
Attorney, Agent, or Firm—Head & Johnson

[57] ABSTRACT

In a dual stage power transistor type amplifier in which a video signal is applied to the base of a first stage transistor and in which the output of the first stage is direct coupled to the emitter of the second or power stage, and in which the second stage has a substantially constant d.c. voltage applied to its base, and a higher constant d.c. voltage applied to its collector through a load impedance. A voltage limiting device such as a Zener diode is shunted across at least a portion of the load impedance. With the fixed voltage on the base and a limited d.c. voltage on the collector, saturation and overload of the transistor is prevented.

1 Claim, 2 Drawing Figures

OVERLOAD PROTECTION TO PREVENT SATURATION OF VIDEO AMPLIFIERS

BACKGROUND OF THE INVENTION

1. Field of the Invention

This invention lies in the field of video alphanumeric displays, which generally utilize computer generated signals which are impressed upon cathode ray tubes for display. A general requirement for the amplifiers to drive the cathode ray tubes is that they must be broad band and must have uniform gain from approximately 0 Hertz to 20-30 megahertz.

2. Description of the Prior Art

In the commonly used circuits which drive the cathode ray tube in such display circuits, inadequate attention has been placed upon the protection of the output stage of the power amplifier and instead, manual gain control of the input stage has been provided, so as to limit the overall gain of the system and in that way prevent overload of the output stage.

There are a number of serious disadvantages with this conventional type circuit. For example, it is expensive, because considerable manual labor time must be taken to adjust for proper operation the input gain control. Further, it has reduced reliability because it utilizes a variable potentiometer on the input which typically has lower reliability than fixed impedance elements. Also, it is non-automatic, and therefore, the setting must be changed for different signal levels and different operating conditions.

SUMMARY OF THE INVENTION

It is a primary object of this invention to provide an improved multi-stage power transistor amplifier for driving cathode ray tubes in information display systems. More particularly, it concerns an improvement in driver amplifiers for cathode ray tubes, in which means are provided to prevent the overload of the output stage.

These and other objects are realized and the limitations of the prior art are overcome in this invention by providing a dual stage power transistor amplifier, in which a video signal is applied to the base of the first stage through a fixed impedance, and in which the output of the first stage is direct coupled to the emitter of the second stage, and in which the second stage has a substantially constant voltage applied to its base and a substantially constant high d.c. voltage applied to its collector through a load impedance.

As the load current increases, the voltage across the load impedance increases, and lowers the potential applied to the collector of the second stage. The magnitude of this voltage across the load impedance is limited by a Zener diode, or equivalent, so as to set a minimum value of voltage on the collector of the second stage and thus limit its minimum output voltage to a value above that at which saturation occurs.

BRIEF DESCRIPTION OF THE DRAWINGS

These and other objects and advantages of this invention and a better understanding of the principles and details of the invention will be evident from the following description taken in conjunction with the appended drawings in which.

DESCRIPTION OF THE PREFERRED EMBODIMENT

Figure 1:
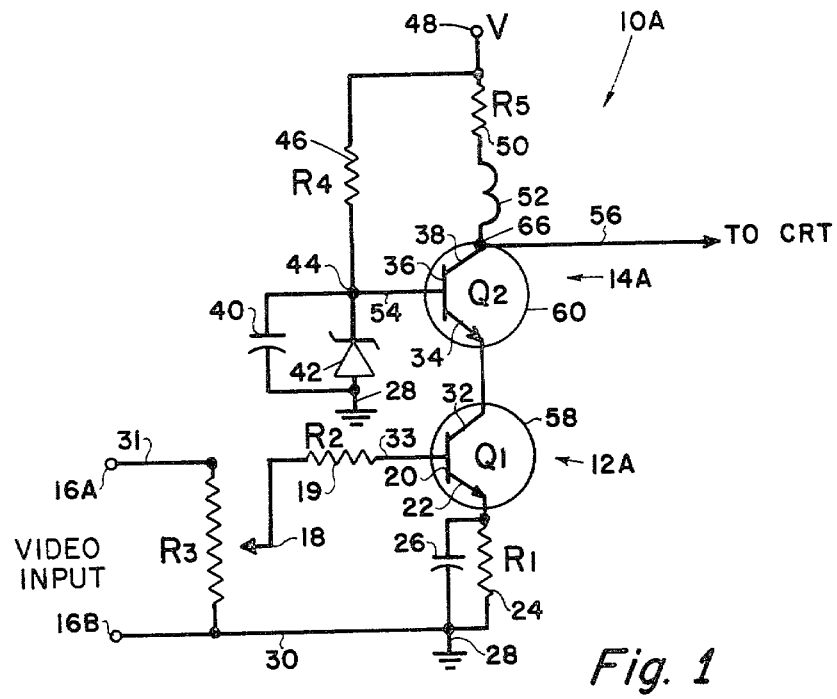
FIG. 1 illustrates a prior art system.

Referring now to the drawings and in particular to FIG. 1, there is shown a commonly used type of cathode ray driver amplifier, indicated generally by the numeral 10A. This includes a first stage transistor Q1, indicated generally by the numeral 12A, and a second stage transistor Q2 indicated generally by the numeral 14A. The emitter 22 of the transistor Q1, numeral 58, is connected to ground through a resistor R1, numeral 24, through lead 28. The emitter resistor is shunted by a capacitor 26, as is conventional.

The video input signal is supplied to terminals 16A and 16B, and leads 31 and 30. A potentiometer R3, with slider 18 is provided for controlling the amplitude of signal applied to the base 20 of the transistor 58 through a load resistor R2, numeral 19. The collector 32 of Q1 is direct connected to the emitter 34 of power transistor Q2, numeral 60. The base 36 is supplied with a substantially constant voltage in the range of slightly over 5 volts above ground by means of a voltage dropping resistor R4, numeral 46, from the high voltage terminal V, numeral 48. The resistor 46 is connected to a Zener diode 42 through junction 44 and then to ground through lead 28. The Zener diode is shunted by a capacitor 40.

The base 36 is connected to the junction 44 by lead 54 and is maintained at a substantially constant selected voltage above ground by a means just described. The collector 38 of the transistor 60 is connected to the high voltage terminal 48 through a load impedance comprising resistance R5, numeral 50, in series with a frequency compensating inductance 52.

It will be clear from analyzing the operation of the circuit of FIG. 1 that when a large current flows through the load impedance 50, 52 and through the collector 38, and through the transistor 60, the voltage of the collector may drop to a low enough voltage compared to the base voltage on junction 44 so as to cause saturation of the transistor 60. In order to prevent this, the gain control potentiometer R3 is adjusted to reduce the signal level of the video signal applied to Q1 so as to maintain a low enough output current, so that the transistor 60 is never overloaded and saturated.

This manner of controlling the overload condition of the amplifier is unsatisfactory since it is expensive, has less reliability, and is non-automatic, requiring manual settings of the input signal level which varies for different conditions.

Figure 2:
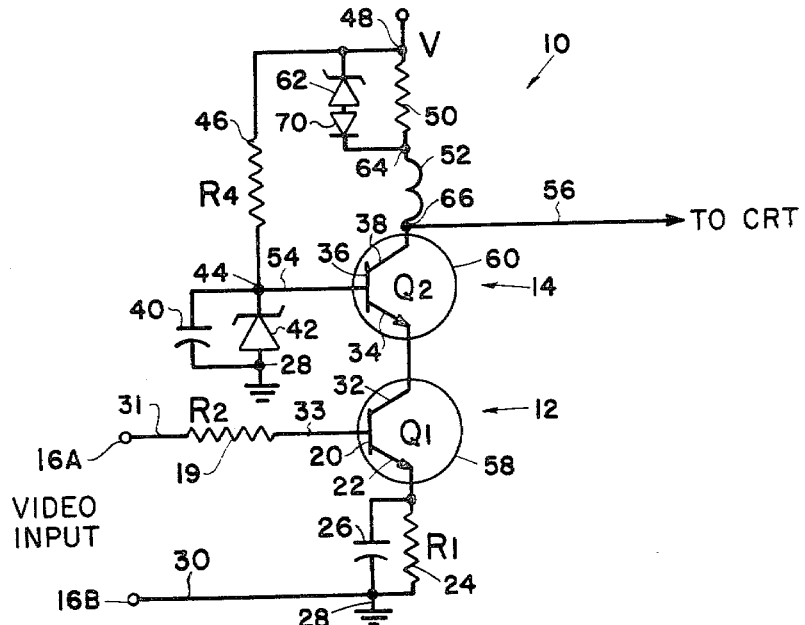
FIG. 2 illustrates one embodiment of the present invention.

Referring now to FIG. 2, there is shown an improved circuit. This circuit also uses a two-stage direct coupled amplifier. However, in FIG. 2 there is no gain control on the input to the base 20 of transistor 58, and the input video signal goes directly from the input terminals 16A and 16B through load resistor 19, and by leads 33 and 30 to the base of transistor 58 and ground 28. Again, the emitter 22 of transistor 58 is connected to ground through a resistor 24, which is shunted by capacitor 26.

The emitter of the second transistor 60 is direct connected to the collector 32 of the first transistor 58. The base 36 of the second transistor is maintained at a constant low d.c. voltage on lead 54 by means of the series resistance 46 connected from the voltage source 48, to junction 44, and through the Zener diode 42 to ground.

The collector 38 of the second transistor 60 is coupled to the high d.c. voltage source 48 through an impedance composed of resistor 50 and inductor 52. However, in this embodiment, the resistance element 50 of the impedance is shunted by means of a voltage limiting device such as a low capacitance Zener diode 62, which is connected between the voltage terminal 48 and junction 64 as shown. The Zener diode 62 could, if desired, be connected across the entire impedance 50, 52, that is, between the high voltage 48 and the junction 66. The lead 56 is the output lead to the cathode ray tube which is to be driven.

In operation, when the video signal is low amplitude, the potential of junction 66 will vary in conformity with the input signal, over a range of voltage which is well within the voltage on the collector 38 for which linear operation and non-saturation is provided. In this case, the maximum voltage across the impedance between 48 and 64 is less than the breakdown voltage of the Zener diode. However, if a large signal amplitude is provided to the video amplifier, and the voltage of junction point 66 drops to a value of voltage below 48, greater than the control voltage of the Zener diode 62, it will limit the voltage and thus restrict the output signal accordingly, without saturating the transistor 60 and causing signal distortion. As the input video signal reduces amplitude, the situation goes back to the condition in which the swing of the junction 66 is less than the Zener voltage, and linear operation of the amplifier then continues.

The load inductance 52 is commonly used in wide band amplifiers to compensate for the high frequency fall-off caused by the capacitance of the load 56. The total capacitance of the CRT and its associated wiring at point 66 is compensated—at the frequency where the gain has fallen to 0.707 of the gain at low frequency—by placing an inductive reactance equal to the capacitive reactance at this frequency.

Shown in series with the Zener diode 62 in FIG. 2 is a conventional diode 70. The performance of this circuit requires that the capacitance of the Zener diode when non-conducting be low. This property is not specified by the manufacturer and varies widely between samples. Some Zener diodes have a capacitance too high to be used. To overcome this excess capacitance, a standard signal diode is used in series with the Zener diode 62. The standard diode has a specified low capacitance and keeps the combined capacitance of series diodes 62 and 70 to a value less than that of the diode 70, when the Zener is non-conducting.

While the invention has been described with a certain degree of particularity, it is manifest that many changes may be made in the details of construction and the arrangement of components without departing from the spirit and scope of this disclosure. It is understood that the invention is not limited to the embodiments set forth herein for purposes of exemplification, but is to be limited only by the scope of the attached claim or claims, including the full range of equivalency to which each element thereof is entitled.

What is claimed is:

1. A transistor power amplifier for video circuits, having tandem input stage and power output stage, having automatic means to prevent overload and saturation of said power stage, comprising:
   (a) an input transistor amplifier having its emitter connected to ground through a parallel resistor and capacitor; its base connected to a source of video signals through an input resistor; and its collector connected to the emitter of said output power stage transistor;
   (b) the base of said power stage transistor connected to a d.c. voltage source of selected magnitude through a series resistor, and to ground through a parallel capacitor and Zener diode, and its collector connected to a high voltage d.c. source of selected magnitude, through a selected load impedance;
   (c) said collector of said power stage transistor also connected to an output means; and
   (d) Zener diode means connected directly across at least a part of said load impedance to limit the magnitude of d.c. voltage across said at least part of said load impedance to a selected magnitude.

* * * * *